(12) United States Patent
Takata et al.

(10) Patent No.: US 12,007,530 B2
(45) Date of Patent: Jun. 11, 2024

(54) PHOTONIC CRYSTAL OPTICAL RESONATOR AND METHOD FOR FABRICATING SAME

(71) Applicant: Nippon Telegraph and Telephone Corporation, Tokyo (JP)

(72) Inventors: Kenta Takata, Tokyo (JP); Masaya Notomi, Tokyo (JP); Akihiko Shinya, Tokyo (JP); Eiichi Kuramochi, Tokyo (JP); Hideaki Taniyama, Tokyo (JP); Shota Kita, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 355 days.

(21) Appl. No.: 17/430,375

(22) PCT Filed: Jan. 31, 2020

(86) PCT No.: PCT/JP2020/003700
§ 371 (c)(1),
(2) Date: Aug. 12, 2021

(87) PCT Pub. No.: WO2020/166387
PCT Pub. Date: Aug. 20, 2020

(65) Prior Publication Data
US 2022/0066068 A1   Mar. 3, 2022

(30) Foreign Application Priority Data

Feb. 14, 2019   (JP) .................................. 2019-024296

(51) Int. Cl.
*G02B 1/00*       (2006.01)
*G02B 6/122*      (2006.01)
*H01S 5/10*       (2021.01)

(52) U.S. Cl.
CPC ........... *G02B 1/005* (2013.01); *G02B 6/1225* (2013.01); *H01S 5/10* (2013.01)

(58) Field of Classification Search
CPC ...... G02B 1/005; G02B 6/1225; B82Y 20/00; H01S 5/10
See application file for complete search history.

(56) References Cited

U.S. PATENT DOCUMENTS 7,224,862 B2 * 5/2007 Noda .................... G02B 6/1225
                                                385/24
11,747,558 B2 * 9/2023 Kuramochi .............. G02B 6/13
                                                385/129

FOREIGN PATENT DOCUMENTS

EP   1445630 A2 *  8/2004 ............... A41D 1/00
JP   2002314194 A   10/2002
(Continued)

OTHER PUBLICATIONS

Asano, T. et al., "Photonic Crystal Nanocavity with a Q Factor Exceeding Eleven Million," Optics Express, vol. 25, No. 3, Feb. 6, 2017, 9 pages.
(Continued)

*Primary Examiner* — Daniel Petkovsek
(74) *Attorney, Agent, or Firm* — Slater Matsil, LLP

(57) ABSTRACT

Each of six first lattice elements adjacent to a light confinement portion shifts from a lattice point in a direction of separating from the light confinement portion, and each of twelve second lattice elements shifts from a lattice point in a direction of separating from the light confinement portion. The second lattice elements are lattice elements arranged to be adjacent to the first lattice elements on a side of separating from the light confinement portion. Moreover, each of the first lattice elements has a smaller diameter than other lattice elements arranged on lattice points.

9 Claims, 4 Drawing Sheets

(56) References Cited

FOREIGN PATENT DOCUMENTS

JP   2008216883 A   9/2008
JP   2016154164 A   8/2016

OTHER PUBLICATIONS

Kim, G. et al., "Coupling of Small, Low-Loss Hexapole Mode with Photonic Crystal Slab Waveguide Mode," Optics Express, vol. 12, No. 26, Dec. 27, 2004, 8 pages.
Minkov, M. et al., "Automated Optimization of Photonic Crystal Slab Cavities," Scientific Reports, vol. 4, No. 5124, May 30, 2014, 8 pages.
Notomi, M. et al., "Femtojoule/bit Integrated Nanophotonics Based on Photonic Crystals," IEICE Electronics Express, vol. 10, No. 12, Jun. 25, 2013, 19 pages.
Ryu, H. et al., "High-Quality-Factor and Small-Mode-Volume Hexapole Modes in Photonic-Crystal-Slab Nanocavities," Applied Physics Letters, vol. 83, No. 21, Nov. 24, 2003, 3 pages.
Takagi, H. et al., "High Q H1 Photonic crystal nanocavities with Efficient Vertical Emission," Optics Express, vol. 20, No. 27, Dec. 17, 2012, 9 pages.

\* cited by examiner

PHOTONIC CRYSTAL OPTICAL RESONATOR AND METHOD FOR FABRICATING SAME

CROSS-REFERENCE TO RELATED APPLICATIONS

This patent application is a national phase filing under section 371 of PCT/JP2020/003700, filed Jan. 31, 2020, which claims the priority of Japanese patent application no. 2019-024296, filed Feb. 14, 2019, each of which is incorporated herein by reference in its entirety.

TECHNICAL FIELD

The present invention relates to a photonic crystal optical resonator and a method of producing the same.

BACKGROUND

For main photonic crystal devices applied to optical circuit technologies, there are used two-dimensional photonic crystals, for example, in which cylindrical cavities with about 200 nm to 300 nm of diameter are arranged as lattice elements 111 to a lattice in a base part composed of a plate-like semiconductor with hundreds of nanometers of thickness. Each lattice element is a region with a low refractive index. In particular, a two-dimensional photonic crystal in which lattice elements are arranged into a triangular lattice functions as an optical insulator which does not transmit light in a designed specific wavelength region inside.

Photonic crystal optical resonators which have a function of strongly confining light very partially in the aforementioned photonic crystal are gathering attention. They can be applied to a wide range of uses such as reinforcement in light emission of fine gain media such as optical memories, optical switches, atoms, quantum wells and quantum dots, lasers, and optical delay based on slow-light effects by integrating one or more photonic crystal optical resonators (refer to Non-Patent Literature 1).

An optical resonator using a photonic crystal is typically formed by producing lattice elements which are constituent components of the photonic crystal by removing one or more of those. A portion (set of lattice points) having the lattice elements removed is a defect of the photonic crystal. When the base part of the photonic crystal is composed of semiconductor, such a defect is a region composed of semiconductor and having a high refractive index. Moreover, the defect is enclosed on its periphery by the photonic crystal which is an optical insulator. According to these, light can be confined in the defect of the photonic crystal. It is nevertheless generally known that simple removal of lattice elements does not make the light confinement at the place of the defect so strong.

A photon lifetime representing a length of time for which light can be confined in the portion of the defect (light confinement portion) of the aforementioned photonic crystal optical resonator is about one picosecond to about ten picoseconds for the light in the communication wavelength band. Moreover, an index, for the photonic crystal optical resonator, which is proportional to the photon lifetime and the frequency of the light and is called a Q value is about one thousand to about ten thousand ($10^3$ to $10^4$).

Emission losses which a specific characteristic electromagnetic wave mode of a photonic crystal optical resonator suffers have been reduced by slightly changing the positions and the sizes of lattice elements 111 the periphery of the portion of the defect, in order to strongly confine light in the light confinement portion of the resonator and increase the photon lifetime and the Q value. Maximum values, of these indices, to be achieved vary depending on differences in material of the base part and method of forming the photonic crystal optical resonator. In particular, H-type resonators and L-type resonators can realize the structure of a resonator within a small region, and moreover, they have been studied for a long time.

Notably, the H-type resonators are resonators with a point defect-type light confinement portion which has a certain lattice element as its center and is obtained by removing this lattice element as the center and a layer of lattice elements forming a shell therearound. Moreover, the L-type resonators are resonators with a line defect-type light confinement portion obtained by removing several lattice elements linearly lining up. Optimized theoretical Q values of these photonic crystal optical resonators by numerical simulation are not less than one million and less than ten million ($10^6$ to $10^7$) (refer to Non-Patent Literature 2 and Patent Literature 1).

There is recently proposed a method of designing a resonator which can achieve a theoretical Q value exceeding one hundred million ($1 \times 10^8$) (refer to Non-Patent Literature 3). It is considered that realizing such a high theoretical Q value should need to form a line defect waveguide structure obtained by removing one layer of lattice elements with the width of the line defect partially changed (mode gap type) or with the space period (lattice constant) of peripheral lattice element layers of the line defect changed (heterostructure type). These however lead to forming a relatively large defect in the photonic crystal and changing a wide range of the structure thereof. Therefore, when with the aforementioned technologies, devices of different types are integrated with the resonator in its periphery, the integrated devices generally result in deteriorating under the influence of their structure changes. Therefore, a resonator with a high Q value as above is disadvantageous to densely integrate a plurality of devices.

CITATION LIST

Patent Literature

Patent Literature 1: Japanese Patent Laid-Open No. 2016-154164
Patent Literature 2: Japanese Patent Laid-Open No. 2002-314194

Non-Patent Literature

Non-Patent Literature 1: M. Notomi et al., "Femtojoule/bit integrated nanophotonics based on photonic crystals", IEICE Electronics Express, vol. 10, no. 12, pp. 1-19, 2013.
Non-Patent Literature 2: M. Minkov and V. Savona, "Automated optimization of photonic crystal slab cavities", Scientific Reports, vol. 4, Article number: 5124, 2014.
Non-Patent Literature 3: T. Asano et al., "Photonic crystal nanocavity with a Q factor exceeding eleven million", Optics Express, vol. 25, no. 3, pp. 1769-1777, 2017.
Non-Patent Literature 4: H. Y. Ryu and M. Notomi, "High-quality-factor and small-mode-volume hexapole modes in photonic-crystal-slab nanocavities", Applied Physics Letters, vol. 83, no. 21, pp. 4294-4296, 2003.

Non-Patent Literature 5: G. H. Kim and Y. H. Lee, "Coupling of small, low-loss hexapole mode with photonic crystal slab waveguide mode", Optics Express, vol. 12, no. 26, pp. 6624-6631, 2004.

Non-Patent Literature 6: H. Takagi et al., "High Q H1 photonic crystal nanocavities with efficient vertical emission", Optics Express, vol. 20, no. 27, pp. 28292-28300, 2012.

SUMMARY

Technical Problem

As mentioned above, photonic crystal optical resonators which can achieve theoretical Q values exceeding one hundred million have disadvantageous structures to densely integrate a plurality of devices in the periphery of such a resonator. In order to densely integrate a plurality of devices in the periphery of a resonator without deteriorating the device, an H1-type photonic crystal optical resonator is advantageous which has the portion of a point defect obtained by removing only one lattice element as a light confinement portion. Maximum values of theoretical Q values of H1-type photonic crystal optical resonators, however, have been about three million ($3 \times 10^6$) and photon lifetimes thereof have been about 2.5 nanoseconds (refer to Non-Patent Literature 4 and Non-Patent Literature 5), and high Q values have not been obtained.

Embodiments of the present invention can solve the problems as above, and an embodiment thereof obtains a higher Q value for an H1-type photonic crystal optical resonator.

Means for Solving the Problem

There is provided a photonic crystal optical resonator according to embodiments of the present invention, including: a plate-like photonic crystal main body including a base part and a plurality of columnar lattice elements each having a different refractive index from that of the base part, the plurality of lattice elements being provided on the base part periodically in a triangular lattice at intervals not more than a wavelength of targeted light; and a light confinement portion composed of a point defect configured by a portion obtained by removing at least one of the lattice elements on lattice points of the photonic crystal main body, wherein each of six first lattice elements adjacent to the light confinement portion shifts from a lattice point in a direction of separating from the light confinement portion, each of twelve second lattice elements adjacent to the first lattice element on a side of separating from the light confinement portion shifts from a lattice point in a direction of separating from the light confinement portion, and each of the first lattice elements has a smaller diameter than other lattice elements.

In an exemplary configuration of the aforementioned photonic crystal optical resonator, amounts of the shifts, and the diameter of the first lattice elements are optimized to meet a difference in refractive index between the base part and the lattice elements such that a Q value of the resonator is maximized.

In an exemplary configuration of the aforementioned photonic crystal optical resonator, the lattice elements have a circular columnar shape, a radius of the lattice elements is set to be any value within a range from 0.3 times to 0.325 times a distance between the adjacent lattice elements, a radius of the first lattice elements is set to be any value within a range from 0.225 times to 0.255 times the distance between the adjacent lattice elements, the amount of the shift of the first lattice elements is set to be any value within a range from 0.165 times to 0.25 times the distance between the adjacent lattice elements, and an amount of the shift of the second lattice elements is set to be any value within a range from 0.038 times to 0.054 times the distance between the adjacent lattice elements.

A method of producing a photonic crystal optical resonator according to embodiments of the present invention is provided. The photonic crystal optical resonator includes a plate-like photonic crystal main body including a base part and a plurality of columnar lattice elements each having a different refractive index from that of the base part, the plurality of lattice elements being provided on the base part periodically in a triangular lattice at intervals not more than a wavelength of targeted light; and a light confinement portion composed of a point defect configured by a portion obtained by removing at least one of the lattice elements on lattice points of the photonic crystal main body, wherein each of six first lattice elements adjacent to the light confinement portion shifts from a lattice point in a direction of separating from the light confinement portion, each of twelve second lattice elements adjacent to the first lattice element on a side of separating from the light confinement portion shifts from a lattice point in a direction of separating from the light confinement portion, and each of the first lattice elements has a smaller diameter than other lattice elements. The method includes simultaneously performing optimization of an amount of the shift of the first lattice elements, optimization of an amount of the shift of the second lattice elements, and optimization of a diameter of the first lattice elements such that a Q value of the resonator is maximized.

Effects of Embodiments of the Invention

Based on the description above, according to embodiments of the present invention, a higher Q value can be obtained from an H1-type photonic crystal optical resonator.

DETAILED DESCRIPTION OF ILLUSTRATIVE EMBODIMENTS

Figure 1:
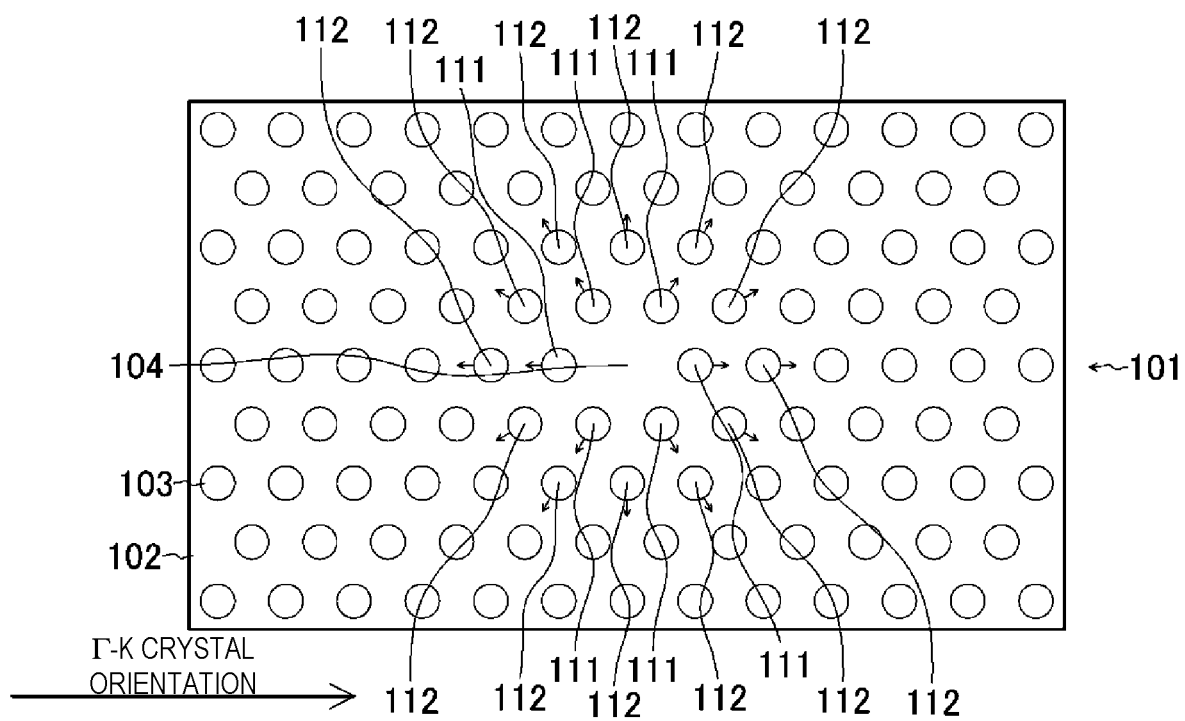
FIG. 1 is a plan view showing a configuration of a photonic crystal optical resonator according to an embodiment of the present invention.

Hereafter, a photonic crystal optical resonator according to an embodiment of the present invention is described with reference to FIG. 1.

This photonic crystal optical resonator primarily includes a base part 102 and a plurality of columnar lattice elements 103 each having a different refractive index from that of the base part 102. Moreover, it includes a plate-like photonic crystal main body 101 in which the plurality of lattice elements 103 are provided on the base part 102 periodically in a triangular lattice at intervals not more than a wavelength of targeted light. The photonic crystal main body 101 is a so-called two-dimensional slab-type photonic crystal. The base part 102 is desirably composed of semiconductor having a high refractive index not less than about 3.0 near a resonant wavelength of the targeted light. Examples of a material of the base part 102 include silicon, gallium arsenide, indium phosphide and gallium phosphide. Moreover, each lattice element 103 exemplarily has a circular columnar hollow structure.

Moreover, the photonic crystal optical resonator includes a light confinement portion 104 provided in the photonic crystal main body 101 and composed of a point defect configured by a portion obtained by removing at least one of the lattice elements 103 on lattice points of the photonic crystal. The light confinement portion 104 is composed of the point defect obtained by removing one lattice element 103 of the photonic crystal.

Moreover, in the photonic crystal optical resonator, six first lattice elements 111 adjacent to the light confinement portion 104 each shifts from a lattice point in a direction of separating from the light confinement portion 104, and twelve second lattice elements 112 each shifts from a lattice point in a direction of separating from the light confinement portion 104. The second lattice elements 112 are lattice elements arranged to be adjacent to the first lattice elements 111 on a side of separating from the light confinement portion 104. Moreover, the first lattice elements 111 each have a smaller diameter than other lattice elements 103 arranged on lattice points.

Amounts of the shifts, and the diameter of the first lattice elements 111 mentioned above are optimized to meet a difference in refractive index between the base part 102 and the lattice elements 103 such that a Q value of the resonator is maximized. Moreover, when each lattice element 103 has a circular columnar hollow structure, a radius of the lattice elements 103, a radius of the first lattice elements 111, the amount of the shift of the first lattice elements 111, and the amount of the shift of the second lattice elements 112 are respectively set to be the following values. The radius of the lattice elements 103 is set to be any value within a range from 0.3 times to 0.325 times the distance between the adjacent lattice elements 103. The radius of the first lattice elements 111 is set to be any value within a range from 0.225 times to 0.255 times the lattice constant. The amount of the shift of the first lattice elements 111 is set to be any value within a range from 0.165 times to 0.25 times the lattice constant. The amount of the shift of the second lattice elements 112 is set to be any value within a range from 0.038 times to 0.054 times the lattice constant. Notably, the lattice constant is the distance between the adjacent lattice elements 103.

This will be hereafter described more in detail. The following primarily assumes that the lattice constant is a, and the radius of the lattice elements 103 is $R_0$. Moreover, a thickness of the base part 102 is assumed to bet. In this photonic crystal optical resonator, it is assumed that the radius of the six first lattice elements 111 which are outward of the light confinement portion 104 composed of a point defect by one layer to form the innermost shell is a smaller value $R_1$ than $R_0$. Moreover, each of the positions of the six first lattice elements 111 is shifted from the position of the corresponding lattice point by a distance $s_1$ outward along the radial direction relative to the center of the light confinement portion 104 (resonator center). Furthermore, it is assumed that a radius $R_2$ of the twelve second lattice elements 112 which are outward of the light confinement portion 104 by two layers to form the second inner shell is $R_0$ identical to those of the other lattice elements 103. Moreover, each of the positions of the twelve second lattice elements 112 is shifted from the position of the lattice point by a distance $s_2$ outward along the radial direction relative to the resonator center.

Figure 2A:
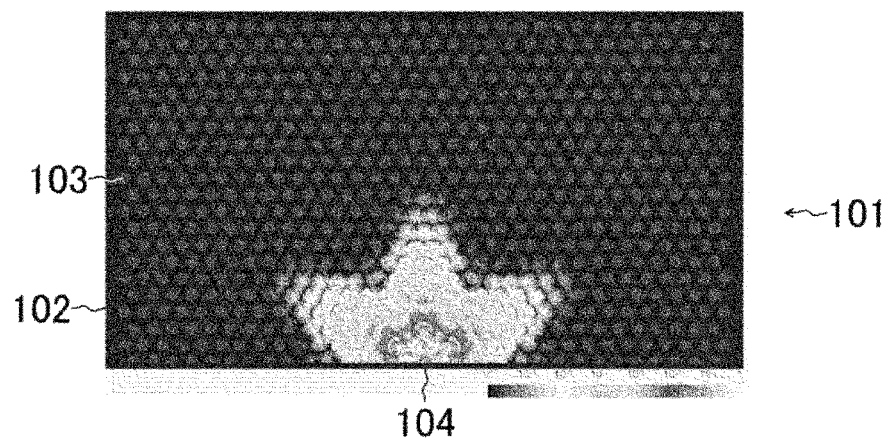
FIG. 2A is a distribution diagram showing an in-plane distribution of an electric field strength of the photonic crystal optical resonator in the embodiment.
Figure 2B:
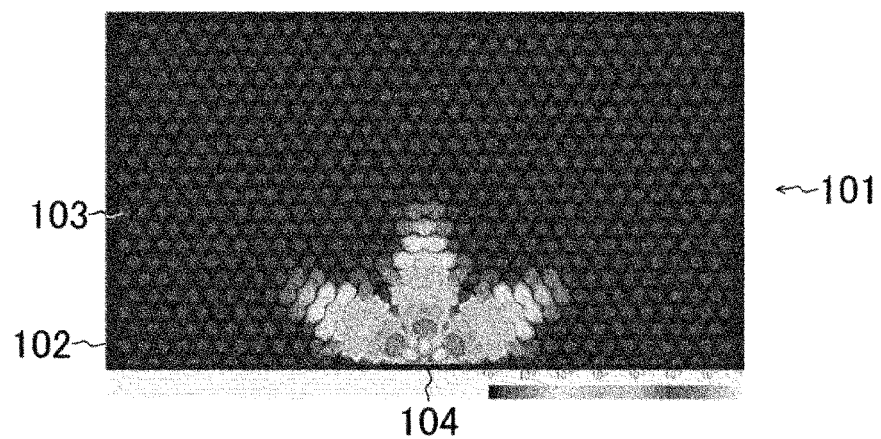
FIG. 2B is a distribution diagram showing an in-plane distribution of a magnetic field strength of the photonic crystal optical resonator in the embodiment.
Figure 3:
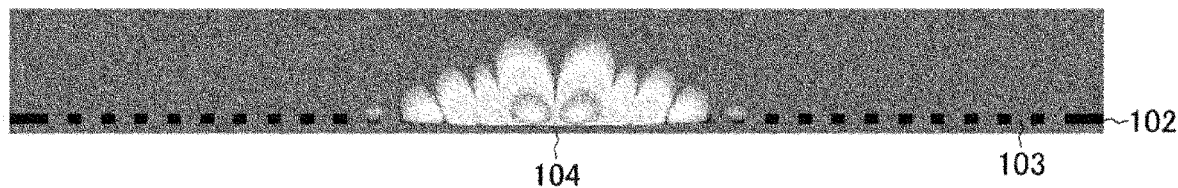
FIG. 3 is a distribution diagram showing a distribution of the magnetic field strength of the photonic crystal optical resonator in the embodiment in the direction perpendicular to the plane thereof.

A characteristic resonator mode for optimizing characteristics of a photonic crystal optical resonator in the embodiment is called a hexapole mode as shown in FIG. 2A, FIG. 2B and FIG. 3. Notably, each of FIG. 2A, FIG. 2B and FIG. 3 shows the half side for convenience of calculation. The name of the hexapole mode is originated from the magnetic field distribution thereof exemplarily shown in FIG. 2B having six antinodes (poles) over the entirety of the mode. The hexapole mode is characterized in having the odd 60-degree rotational symmetry (hexad symmetry) with the resonator center being as the origin. Since according to this, adjacent antinodes are antiphases with respect to each other, components of emission perpendicular to the plane near the light confinement portion 104 spontaneously cancel one another, which advantageously tends to reduce losses (refer to FIG. 3).

Meanwhile, the center of the light confinement portion 104 is a node (zero point) of the electromagnetic field in the hexapole mode. Therefore, in order to obtain an interaction between the electromagnetic field and a substance such as a gain medium buried in the light confinement portion 104 for the purpose of application to optical devices and the like, the substance to be coupled needs to be arranged so as to overlap with the antinodes in the periphery of the point defect, not arranged at the center thereof. Accordingly, the characteristic resonator mode of optimization for a photonic crystal optical resonator in the embodiment has different characteristics and uses from that having an antinode at the center of the defect as mentioned in Non-Patent Literature 6 or Patent Literature 2.

The first lattice elements 111 strongly affect the shape of the mode and the resonant wavelength. Accordingly, by optimizing the radius $R_1$ and the distance of the shift (amount of the shift) $s_1$ of the first lattice elements 111, emission losses, in particular, in the direction perpendicular to the plane of the base part 102 can be reduced. Moreover, optimization of the distance of the shift (amount of the shift) $s_2$ of the second lattice elements 112 has an effect of making an effective refractive index gradient due to the photonic crystal near the light confinement portion 104 moderate. Since this optimization can restrain eigenmode from spreading, in particular, in the plane of the base part 102, in-plane emission losses can be reduced.

Improvement of the Q value by the optimization of the radius $R_1$ and the amount $s_1$ of the shift of the first lattice elements 111 is known as in Non-Patent Literature 4 and Non-Patent Literature 5. Moreover, improvement of the Q value by the optimization of the amount $s_2$ of the shift of the second lattice elements 112 is known as in Non-Patent Literature 2. However, even if the optimization of the radius $R_1$ and the amount $s_1$ of the shift of the first lattice elements 111 and the optimization of the amount $s_2$ of the shift of the second lattice elements 112 are individually performed, the theoretical Q value is not improved.

Figure 4:
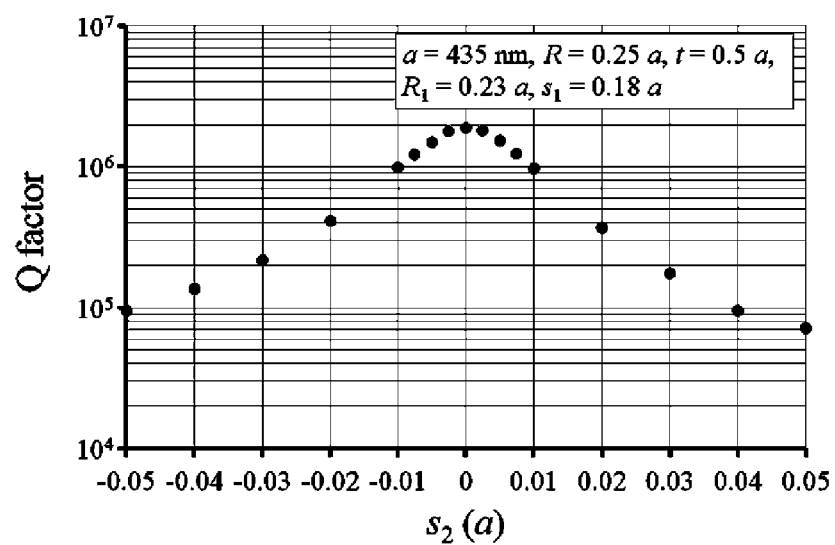
FIG. 4 is a characteristic diagram showing a change of a Q value in the case where an amount $s_2$ of a shift of second lattice elements 112 is optimized in the state where a radius $R_1$ and an amount $s_1$ of a shift is optimized.

For example, first, the radius $R_1$ and the amount $s_1$ of the shift of the first lattice elements 111 are optimized. Even if after that in the state where the radius $R_1$ and the amount $s_1$ are optimized, the amount $s_2$ of the shift of the second lattice elements 112 is optimized, the theoretical Q value is not improved, as shown in FIG. 4. Therefore, simultaneous optimizations of the radius $R_1$, the distance $s_1$ and the distance $s_2$ have not conventionally been considered as improving the theoretical Q value. Moreover, a technology has not been known that realizes any eigen mode, in particular, with one hundred million or more of theoretical Q value among all the modes of L-type and H-type resonators, which have a relatively small resonator region.

The inventors have been carefully studying on simultaneous optimization of the radius $R_1$, the amount $s_1$ of the shift, and the amount $s_2$ of the shift and searching for conditions for achieving a long lifetime of photons in the hexapole mode of an H1-type resonator and for obtaining a local maximum of the Q value. As a result, they have found that by simultaneously performing the optimization of the radius $R_1$, the optimization of the amount $s_1$ of the shift, and the optimization of the amount $s_2$ of the shift, an eigenmode with one hundred million or more of theoretical Q value can be realized on the H1-type photonic crystal optical resonator under the following optimum conditions.

Although the optimum conditions vary depending on the refractive index of the material of the base part 102, it has become apparent that for a lattice constant a, conditions under which a high theoretical Q value can be obtained exist approximately within ranges in which the thickness t of the base part 102 is set to be about 0.5a to 0.6a, the radius $R_0$ of the lattice elements 103 is set to be about 0.300a to 0.325a, the radius $R_1$ of the first lattice elements 111 is set to be about 0.225a to 0.255a, the amount $s_1$ of the shift of the first lattice elements iii from the lattice points is set to be about 0.165a to 0.250a, and the amount $s_2$ of the shift of the second lattice elements 112 from the lattice points is set to be about 0.038a to 0.054a.

An in-plane distribution of an electric field strength shown in FIG. 2A, an in-plane distribution of a magnetic field strength shown in FIG. 2B, and a distribution of the electric field strength in the direction perpendicular to the plane shown in FIG. 3 are the results of simulation of a device of the invention by an FDTD method under an exemplary set of optimum conditions mentioned above. In the simulation for these distributions, it is supposed that the base part 102 is composed of silicon and its refractive index n is 3.47. Moreover, the lattice constant a is set to be 425 nm, the thickness t of the base pall 102 to be 250 nm, the radius $R_0$ of the lattice elements 103 to be 131 nm, the radius $R_1$ of the first lattice elements 111 to be 102 nm, the amount $s_1$ of the shift of the first lattice elements 111 to be 88 nm, and the amount $s_2$ of the shift of the second lattice elements 112 to be 20 nm.

The wavelength of the hexapole mode obtained under the aforementioned conditions is 1552 nm in vacuum. The mode distributions shown in FIG. 2A and FIG. 2B show that the absolute values of the strengths of the electric field and magnetic field amplitudes in the plane of the base part 102 attenuate exponentially with the distance from the resonator center. The electromagnetic field strength attenuates down to about $10^7$ of the maximum strength at about ten lattice elements 103 in the direction away from the resonator center. As compared, for example, with the technology disclosed in Non-Patent Literature 5, the aforementioned attenuation is very strong, which indicates that the in-plane light confinement is strong.

Moreover, as seen from the magnetic field strength distribution in the direction perpendicular to the plane including the cross section of the base part 102 shown in FIG. 3, it is clear that the strong magnetic field concentrates in a portion right above the light confinement portion 104. Moreover, although the magnetic field seeps off, as evanescent waves, into the air on the upper surface of the base part 102, emission losses are reduced since the direction of seeping-off is an oblique direction, instead of the vertical direction, relative to the base part 102. Meanwhile, the volume of the mode has resulted in $0.89(\lambda/n)^3$, which is not so much smaller than those of other high-Q point defect or line defect resonators.

Figure 5:
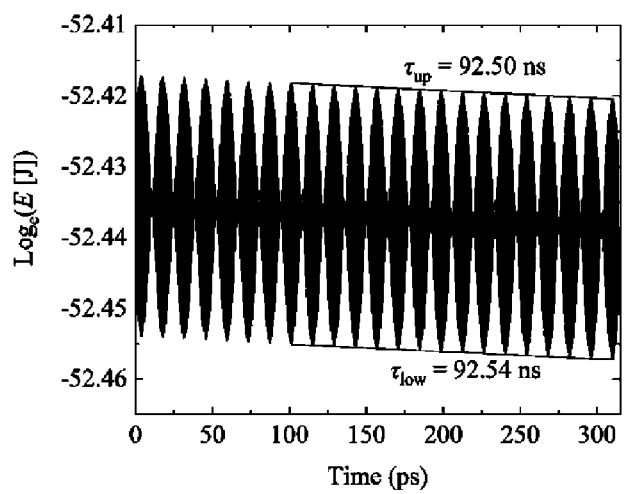
FIG. 5 is a characteristic diagram showing a time decay of electromagnetic wave energy in simulation of the photonic crystal optical resonator in the embodiment in a semilogarithmic graph.

FIG. 5 shows a time decay of electromagnetic wave energy in the aforementioned simulation on a semilogarithmic graph. The photon lifetime represents a time which the energy of the resonator eigenmode in question takes to be 1/e times, and indicates a time which the energy takes to decrease by one as converted on the vertical axis in FIG. 5. It is assumed in the calculation that at the time point of 100 ps after narrow linewidth excitation of the resonator, almost all the residual electromagnetic field energy is originated from the hexapole mode. The upper and lower envelopes, on the curve, drawn from 100 ps are well fitted to energy attenuation characteristics with straight lines, and the photon lifetime obtained from these is 92.5 nanoseconds. Moreover, the corresponding theoretical Q value is $1.12 \times 10^8$, exceeding one hundred million.

Simulation similar to the above was also performed using a finite element method. As a result, it was found that a deviation in local maximum conditions between the different calculations was very small. With 426 nm of lattice constant a, which was larger than the above by 1 nm, and under entirely the same conditions of the other parameters except this, 1556 nm of resonator mode wavelength, $1.24 \times 10^8$ of local minimum theoretical Q value, and 102.2 nanoseconds of photon lifetime were obtained. This indicates that existence of the aforementioned local maximum conditions resulting in a theoretical Q value exceeding one hundred million is reliable. Moreover, summarizing these results, it is indicated that the photonic crystal optical resonator in the embodiment improves the theoretical Q value and the photon lifetime of an H1-type resonator by about 35 times more than the conventional ones.

Among the optimization parameters introduced for embodiments of the present invention, the values of the thickness t of the base part 102 and the radius $R_0$ of the lattice elements 103 do not largely affect the theoretical Q value of the hexapole mode. Therefore, even when the thickness t of the base part 102 is made smaller than the above one by tens of nanometers, conditions for the Q value almost having the local minimum can be obtained merely by changing the radius $R_0$ of the lattice elements 103 by about several nanometers. Also in this case, the theoretical Q value of not less than one hundred million can be maintained when the base part 102 is composed of Si. For example, even when the thickness t of the base part 102 is set to be 230 nm, 1526 nm of resonator mode wavelength and $1.16 \times 10^8$ of theoretical Q value are obtained through calculation by the finite element method when the lattice constant a is set to be 426 nm, the radius $R_0$ of the lattice elements 103 to be 133 nm, the radius $R_1$ of the first lattice elements 111 to be 102 nm, the amount $s_1$ of the shift of the first lattice elements iii to be 88 nm, and the amount $s_2$ of the shift of the second lattice elements 112 to be 20 nm. Moreover, by changing a and $R_0$, the resonator mode wavelength can also be changed without losing the Q value very much.

In the case where the base part 102 is composed of another material, for example, in the case where the base part 102 is composed of one in an InGaAsP mixed crystal system (3.40 of refractive index) which is a III-V group compound semiconductor, 1551 nm of resonator mode wavelength, $1.38 \times 10^7$ of theoretical Q value, and 11.3 nanoseconds of photon lifetime are obtained through calculation by the finite element method when the lattice constant a is set to be 430 nm, the thickness of the base part 102 to be 250 nm, the radius $R_0$ of the lattice elements 103 to be 130 nm, the radius $R_1$ of the first lattice elements 111 to be 106 nm, the amount $s_1$ of the shift of the first lattice elements 111 to be 101 nm, and the amount $s_2$ of the shift of the second lattice elements 112 to be 20 nm.

Moreover, when the base part 102 is composed of similar InGaAsP and the parameters are set as the similar conditions to those in the case where the base part 102 is composed of silicon, a high theoretical Q value is obtained while the wavelength of the targeted light is a shorter wavelength. When the base part 102 is composed of InGaAsP and t is set to be 230 nm, a to be 426 nm, $R_0$ to be 132 nm, $R_1$ to be 102 nm, $s_1$ to be 88 nm, and $s_2$ to be 20 nm, 1500 nm of resonator mode wavelength, $6.95 \times 10^7$ of theoretical Q value, and 55.3 nanoseconds of photon lifetime are obtained.

On the other hand, changes of the parameters other than t, a and $R_0$ largely affect the Q value. In particular, when $R_1$ and $s_2$ vary from the local maximum conditions by about 1 nm, the theoretical Q value decreases to about $\frac{1}{10}$ of the local maximum value. Although solely as to $s_1$, the Q value does not decrease to about $\frac{1}{10}$ unless $s_1$ varies by about 3 nm, one should be careful of handling $s_1$ since its influence is synergistic with changes of $R_1$ and $s_2$. Such influence of change in parameters on the Q value leads to a concern that an experimental Q value might deteriorate due to their structural variations in producing a photonic crystal optical resonator. It should be noted that this influence has similarly existed also in the conventional technologies and the maximum value of experimental Q values of H1-type resonators is about three hundred thousand and that of L-type is about one million. One can sufficiently expect that an experimental Q value exceeds those by carefully producing a photonic crystal optical resonator in accordance with the embodiment.

As described above, with embodiments of the present invention, each of the six first lattice elements adjacent to the light confinement portion shifts from a lattice point in a direction of separating from the light confinement portion, each of the twelve second lattice elements adjacent to the first lattice elements shifts from a lattice point on the side of separating from the light confinement portion in a direction of separating from the light confinement portion, and each of the first lattice elements has a smaller diameter than other lattice elements. As a result, according to embodiments of the present invention, a higher Q value can be obtained for an H1-type photonic crystal optical resonator.

It has been conventionally considered that high Q values exceeding ten million ($1 \times 10^7$) and one hundred million ($1 \times 10^8$) are difficult to realize for photonic crystal optical resonators of point defect type (H type) and of small-scale line defect type (L type). On the contrary, according to embodiments of the present invention, one hundred million of theoretical Q value can be realized, for example, with a photonic crystal optical resonator using silicon, and a Q value exceeding ten million even with a photonic crystal optical resonator using an indium-gallium-arsenic-phosphorus mixed crystal compound.

Moreover, embodiments of the present invention can be realized only by changing the diameters and the positions of lattice elements within a local range of up to two layers enclosing the periphery of the light confinement portion composed of a defect, which means a small occupying region including structural optimization. Therefore, when a plurality of different devices are integrated in its periphery, such as photonic crystal line defect waveguides, directional couplers and other resonators, they can be arranged without disturbing their structures.

In the hexapole mode based on a photonic crystal optical resonator of embodiments of the present invention, even when the theoretical Q value exceeds one hundred million, the volume of the mode merely goes slightly below $(\lambda/n)^3$, not being significantly small, and light spreads in the plane of the base part to some extent. Therefore, as compared with other point defect and line defect resonators, which have a small eigenmode volume, it can be expected to more easily optically couple with other devices such as optical waveguides and optical resonators and be adjusted.

Notably, the present invention is not limited to the embodiments described above, and it is apparent that many modifications and combinations can be made within the technical concepts of the present invention by persons having normal knowledge in the relevant field.

REFERENCE SIGNS LIST

101 Photonic crystal main body
102 Base part
103 Lattice element
104 Light confinement portion
111 First lattice element
112 Second lattice element

The invention claimed is:
1. A photonic crystal optical resonator comprising:
a photonic crystal main body including a base part and a plurality of columnar lattice elements each having a different refractive index from that of the base part, the plurality of columnar lattice elements being provided on the base part spaced apart in a triangular lattice at intervals not more than a wavelength of targeted light; and
a light confinement portion comprising a point defect configured by a portion obtained by removing at least one of the plurality of columnar lattice elements on respective lattice points of the photonic crystal main body;
wherein each of six first lattice elements of the plurality of columnar lattice elements adjacent to the light confinement portion is configured to shift from first lattice points in a direction of separating from the light confinement portion;
wherein each of twelve second lattice elements of the plurality of columnar lattice elements adjacent to the six first lattice elements on a side of separating from the light confinement portion is configured to shift from second lattice points in the direction of separating from the light confinement portion;
wherein each of the six first lattice elements has a smaller diameter than others of the plurality of columnar lattice elements;

wherein optimization of an amount of shift of the six first lattice elements, optimization of an amount of shift of the twelve second lattice elements, and optimization of a diameter of the six first lattice elements such that a Q value of the photonic crystal optical resonator is maximized simultaneously; and wherein the Q value of the photonic crystal optical resonator that is maximized exceeds 10 million.

2. The photonic crystal optical resonator according to claim 1, wherein the amount of the shift and the diameter of the six first lattice elements are optimized to meet a difference in refractive index between the base part and the plurality of columnar lattice elements such that the Q value of the photonic crystal optical resonator is maximized.

3. The photonic crystal optical resonator according to claim 1, wherein each of the plurality of columnar lattice elements has a circular columnar shape.

4. The photonic crystal optical resonator according to claim 3, wherein:
   a radius of third lattice elements of the plurality of columnar lattice elements is set to be any value within a range from 0.3 times to 0.325 times a distance between adjacent ones of the plurality of columnar lattice elements; and
   a radius of the six first lattice elements is set to be any value within a range from 0.225 times to 0.255 times the distance between the adjacent ones of the plurality of columnar lattice elements.

5. The photonic crystal optical resonator according to claim 4, wherein:
   the amount of the shift of the six first lattice elements is set to be any value within a range from 0.165 times to 0.25 times the distance between the adjacent ones of the plurality of columnar lattice elements; and
   the amount of the shift of the twelve second lattice elements is set to be any value within a range from 0.038 times to 0.054 times the distance between the adjacent ones of the plurality of columnar lattice elements.

6. A method of producing a photonic crystal optical resonator, the method comprising:
   providing a photonic crystal main body including a base part and a plurality of columnar lattice elements each having a different refractive index from that of the base part, the plurality of columnar lattice elements being provided on the base part spaced apart in a triangular lattice at intervals not more than a wavelength of targeted light;
   providing a light confinement portion comprising a point defect configured by a portion obtained by removing at least one of the plurality of columnar lattice elements on respective lattice points of the photonic crystal main body;
   shifting each of six first lattice elements adjacent to the light confinement portion from first lattice points in a direction of separating from the light confinement portion, wherein each of the six first lattice elements has a smaller diameter than others of the plurality of columnar lattice elements;
   shifting each of twelve second lattice elements adjacent to the six first lattice elements on a side of separating from the light confinement portion from second lattice points in the direction of separating from the light confinement portion; and
   simultaneously performing optimization of an amount of shift of the six first lattice elements, optimization of an amount of shift of the twelve second lattice elements, and optimization of a diameter of the six first lattice elements such that a Q value of the photonic crystal optical resonator is maximized, wherein the Q value of the photonic crystal optical resonator that is maximized exceeds 10 million.

7. The method according to claim 6, wherein each of the plurality of columnar lattice elements has a circular columnar shape.

8. The method according to claim 7, wherein:
   a radius of third lattice elements of the plurality of columnar lattice elements is set to be any value within a range from 0.3 times to 0.325 times a distance between adjacent ones of the plurality of columnar lattice elements; and
   a radius of the six first lattice elements is set to be any value within a range from 0.225 times to 0.255 times the distance between the adjacent ones of the plurality of columnar lattice elements.

9. The method according to claim 8, wherein:
   the amount of the shift of the six first lattice elements is set to be any value within a range from 0.165 times to 0.25 times the distance between the adjacent ones of the plurality of columnar lattice elements; and
   the amount of the shift of the twelve second lattice elements is set to be any value within a range from 0.038 times to 0.054 times the distance between the adjacent ones of the plurality of columnar lattice elements.

* * * * *